US012804943B2

(12) United States Patent
Xu et al.

(10) Patent No.: US 12,804,943 B2
(45) Date of Patent: Nov. 17, 2026

(54) TRENCH-TYPE DMOS DEVICE AND MANUFACTURING METHOD THEREFOR

(71) Applicant: CSMC TECHNOLOGIES FAB2 CO., LTD., Wuxi (CN)

(72) Inventors: Chaoqi Xu, Wuxi (CN); Shuxian Chen, Wuxi (CN); Feng Lin, Wuxi (CN); Chunxu Li, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 401 days.

(21) Appl. No.: 18/689,029

(22) PCT Filed: Dec. 9, 2022

(86) PCT No.: PCT/CN2022/137942
§ 371 (c)(1),
(2) Date: Mar. 4, 2024

(87) PCT Pub. No.: WO2023/124902
PCT Pub. Date: Jul. 6, 2023

(65) Prior Publication Data

US 2026/0136589 A1 May 14, 2026

(30) Foreign Application Priority Data

Dec. 31, 2021 (CN) ......................... 202111679671.1

(51) Int. Cl.
*H10D 30/66* (2025.01)
*H10D 30/01* (2025.01)
(Continued)

(52) U.S. Cl.
CPC ....... *H10D 30/663* (2025.01); *H10D 30/0297* (2025.01); *H10D 30/668* (2025.01);
(Continued)

(58) Field of Classification Search
CPC .. H10D 30/663; H10D 64/513; H10D 64/518; H10D 64/662; H10D 64/01306; H10D 30/0297; H10D 30/668
See application file for complete search history.

(56) References Cited

U.S. PATENT DOCUMENTS 4,612,465 A * 9/1986 Schutten .............. H10D 30/658 257/124
5,122,848 A * 6/1992 Lee .................... H10B 12/0383 257/E21.652
(Continued)

FOREIGN PATENT DOCUMENTS

CN 1488173 A 4/2004
CN 1992341 A 7/2007
(Continued)

OTHER PUBLICATIONS

ISA State Intellectual Property Office of the People's Republic of China, International Search Report Issued in Application No. PCT/CN2022/137942, Jan. 17, 2023, WIPO, 6 pages.
(Continued)

*Primary Examiner* — Caleen O Sullivan
*Assistant Examiner* — Brett Squires
(74) *Attorney, Agent, or Firm* — Christopher R. Carroll; Carroll, Hoette & Butscher, LLC

(57) ABSTRACT

The present disclosure relates to a trench-type DMOS device and manufacturing method therefor. The trench-type DMOS device includes an expansion gate layer disposed on an inner surface of a gate insulation layer, and the expansion gate layer includes a first expansion gate region with a second conduction type, a second expansion gate region with a first conduction type, and a third expansion gate region, which improves a contradiction relationship between voltage resistance and specific on-resistance of the trench-type DMOS device. Therefore, the trench-type DMOS device has both
(Continued)

high voltage resistance and low specific on-resistance. The trench-type DMOS device has a longitudinal voltage resistance structure, which reduces device area and further decreases device on-resistance. At the same time, a source region and a drain region in the trench-type DMOS device may be led out on its front surface, which is compatible with CMOS.

19 Claims, 8 Drawing Sheets

(51) Int. Cl.

| | |
|---|---|
| ***H10D 64/01*** | (2025.01) |
| ***H10D 64/27*** | (2025.01) |
| ***H10D 64/66*** | (2025.01) |

(52) U.S. Cl.

CPC ..... *H10D 64/01306* (2026.01); *H10D 64/513* (2025.01); *H10D 64/518* (2025.01); *H10D 64/662* (2025.01)

(56) References Cited

U.S. PATENT DOCUMENTS

| | | | | |
|---|---|---|---|---|
| 6,555,872 | B1 | 4/2003 | Dennen | |
| 7,541,641 | B2 | 6/2009 | Ko | |
| 7,883,971 | B2 | 2/2011 | Ko | |
| 9,673,318 | B1 | 6/2017 | Mirchandani et al. | |
| 2002/0190282 | A1 * | 12/2002 | Calafut .................. | H10D 30/66 257/E29.152 |
| 2007/0152245 | A1 | 7/2007 | Ko | |
| 2008/0230787 | A1 | 9/2008 | Suzuki et al. | |
| 2009/0209073 | A1 | 8/2009 | Ko | |
| 2011/0227151 | A1 | 9/2011 | Hsu et al. | |

FOREIGN PATENT DOCUMENTS

| | | | |
|---|---|---|---|
| CN | 102263133 | A | 11/2011 |
| CN | 104241386 | A | 12/2014 |
| CN | 105097936 | A | 11/2015 |
| CN | 107452806 | A | 12/2017 |
| CN | 110120422 | A | 8/2019 |
| CN | 112201687 | A | 1/2021 |
| CN | 113629135 | A | 11/2021 |
| DE | 10211690 | A1 | 9/2002 |

OTHER PUBLICATIONS

ISA State Intellectual Property Office of the People's Republic of China, Written Opinion of the International Searching Authority Issued in Application No. PCT/CN2022/137942, Jan. 17, 2023, WIPO, 5 pages. (Submitted with Machine/Partial Translation).

State Intellectual Property Office of the People's Republic of China, Office Action and Search Report Issued in Application No. 2021116796711, Mar. 20, 2026, 12 pages. (Submitted with English Translation).

* cited by examiner

TRENCH-TYPE DMOS DEVICE AND MANUFACTURING METHOD THEREFOR

CROSS-REFERENCE TO RELATED APPLICATIONS

This application is a national stage of international PCT Application No. PCT/CN2022/137942 filed on Dec. 9, 2022, the entire contents of which are incorporated herein by reference.

TECHNICAL FIELD

The present application relates to the field of semiconductor power device technologies, and in particular, to a trench-type DMOS device and manufacturing method therefor.

BACKGROUND

The development of Bipolar-CMOS (Complementary Metal-Oxide-Semiconductor)-DMOS (Double diffusion Metal Oxide Semiconductor) (BCD) technologies involves the joint development of multiple devices such as Bipolar/CMOS/DMOS, in which the key device is NLDMOS. In general manufacturing processes, an RESURF (Reduced SURfsce Field) technology is commonly used to reduce a surface electric field of a drift region in LDMOS and improve voltage resistance performance of LDMOS. However, in a case of satisfying voltage resistance requirements, a length of the drift region needs to be further increased. More seriously, a relationship between Specific on-Resistance (Rdson) and Breakdown Voltage (BV) of the device may be expressed as Rdson∝BV2.5. That is, increasing the size of the drift region will increase Rdson, which leads to a sharp increase in power consumption, followed by a decrease in device switching speed. VDMOS is of longitudinal voltage resistance. Therefore, compared with LDMOS, lateral voltage resistance is changed to longitudinal voltage resistance, which may reduce a size of the entire device and decrease Rdson. Although a contradiction relationship between voltage resistance and Rdson of the device may be improved, the contradiction relationship between voltage resistance and Rdson of the device still cannot be further improved. In addition, VDMOS cannot be compatible with a CMOS technology due to its drain region being led out of its back surface. Therefore, VDMOS is rarely used in BCD development.

SUMMARY

Based on this, a trench-type DMOS device, which is compatible with a CMOS technology, and manufacturing method therefor are provided.

In a first aspect, there is provided a trench-type Double diffusion Metal Oxide Semiconductor (DMOS) device, including: a drift region with a first conduction type and a main trench disposed in the drift region; a drain region with the first conduction type and a source region with the first conduction type, where the drain region and the source region are disposed on an upper surface of the drift region and on different sides of the main trench; a base region with a second conduction type disposed in the drift region, the base region being in contact with and surrounding the source region; and a trench expansion gate including a gate insulation layer covering a bottom wall and side walls of the main trench, an expansion gate layer covering a surface of the gate insulation layer, and an insulating dielectric region covering the expansion gate layer and fully filling the main trench, where the expansion gate layer includes a first expansion gate region with the second conduction type, a second expansion gate region with the first conduction type, and a third expansion gate region with the first conduction type; the second expansion gate region is disposed on a surface of the gate insulation layer on a side wall of the main trench near the source region, the third expansion gate region is disposed on a surface of the gate insulation layer on a side wall of the main trench near the drain region, and the first expansion gate region is disposed on a surface of the gate insulation layer on the bottom wall of the main trench, and extends to be adjacent to the second expansion gate region and the third expansion gate region along the surface of the gate insulation layer; an interface between the first expansion gate region and the second expansion gate region is located on a same horizontal plane as a lower boundary of the base region, or is lower than the lower boundary of the base region.

In an embodiment, the trench-type DMOS device further includes: a secondary trench, where the secondary trench is located in the drift region, and is in communication with the main trench, and the secondary trench is provided with the second expansion gate region, and a fourth expansion gate region with the second conduction type connected to the second expansion gate region.

In an embodiment, the trench-type DMOS device further includes: a drain electrode electrically connected to the drain region and the third expansion gate region; a source electrode electrically connected to the source region; and a gate electrode electrically connected to the second expansion gate region and the fourth expansion gate region.

In an embodiment, the trench-type DMOS device further includes: abase region lead-out region with the second conduction type located on an upper surface of the base region with the second conduction type, where the base region lead-out region is electrically connected to the source electrode, and the base region lead-out region is connected to the source region in a first direction on the upper surface of the drift region; the first direction and a second direction are different directions, and the second direction is a direction of a connection line between the source region and the drain region.

In an embodiment, a width of the main trench in a second direction on the upper surface of the drift region ranges from 4000 to 10000 angstroms, and/or a width of the secondary trench in a first direction on the upper surface of the drift region ranges from 3000 to 5000 angstroms, and/or a depth of the main trench in a third direction ranges from 16000 to 40000 angstroms, and the third direction is a direction perpendicular to the upper surface of the drift region.

In an embodiment, a length of the second expansion gate region in a third direction ranges from 3000 to 5000 angstroms, and/or a length of the third expansion gate region in the third direction ranges from 2000 to 6000 angstroms, and the third direction is a direction perpendicular to the upper surface of the drift region.

In an embodiment, a thickness of the expansion gate layer ranges from 1000 to 3000 angstroms.

In an embodiment, the first expansion gate region is polycrystalline silicon with the second conduction type, and the second expansion gate region and the third expansion gate region are polycrystalline silicon with the first conduction type.

In a second aspect, there is provided a method for manufacturing a trench-type DMOS device, including: providing a drift region with a main trench, where the drift region is of a first conduction type; forming a gate insulation layer on a bottom wall and side walls of the main trench; forming a first expansion gate region with a second conduction type on a surface of the gate insulation layer; forming an insulating dielectric region on a surface of the first expansion gate region and fully filling the main trench with the insulating dielectric region, where an upper surface of the gate insulation layer between the insulating dielectric region and the side walls of the main trench and an upper surface of the first expansion gate region are exposed through a trench opening of the main trench, and the first expansion gate region is exposed on both sides of the insulating dielectric region; forming a second expansion gate region and a third expansion gate region on the upper surface of the first expansion gate region, where the second expansion gate region and the third expansion gate region are located on different sides of the insulating dielectric region and are in contact with the insulating dielectric region, and the second expansion gate region and the third expansion gate region are of the first conduction type; forming a base region with the second conduction type on an upper surface of the drift region near the second expansion gate region, where a lower boundary of the base region is located on a same horizontal plane as a lower boundary of the second expansion gate region, or the lower boundary of the base region is higher than the lower boundary of the second expansion gate region; forming a source region with the first conduction type on an upper surface of the base region; and forming a drain region with the first conduction type on an upper surface of the drift region near the third expansion gate region.

In an embodiment, forming the first expansion gate region with the second conduction type on the surface of the gate insulation layer includes: forming polycrystalline silicon with the second conduction type as the first expansion gate region on the surface of the gate insulation layer.

In an embodiment, forming the second expansion gate region and the third expansion gate region on the upper surface of the first expansion gate region, where the second expansion gate region and the third expansion gate region are located on different sides of the insulating dielectric region and are in contact with the insulating dielectric region, and the second expansion gate region and the third expansion gate region are of the first conduction type, includes: injecting ions with the first conduction type into the upper surface of the first expansion gate region exposed through the trench opening of the main trench to form the second expansion gate region on a side of the insulating dielectric region and form the third expansion gate region on another side of the insulating dielectric region.

In an embodiment, a depth of the second expansion gate region and a depth of the third expansion gate region penetrating into the main trench range from 3000 to 5000 angstroms.

In an embodiment, providing the drift region with the main trench, where the drift region is of the first conduction type, includes: providing a secondary trench in communication with the main trench in the drift region, forming the gate insulation layer on the bottom wall and the side walls of the main trench, and forming the first expansion gate region with the second conduction type on the surface of the gate insulation layer includes: forming the gate insulation layer on a bottom wall and side walls of the secondary trench, where, while forming the first expansion gate region on the surface of the gate insulation layer in the main trench, the first expansion gate region further covers the gate insulation layer in the secondary trench and fully fills the secondary trench.

In an embodiment, forming the second expansion gate region and the third expansion gate region on the upper surface of the first expansion gate region, where the second expansion gate region and the third expansion gate region are located on different sides of the insulating dielectric region and are in contact with the insulating dielectric region, and the second expansion gate region and the third expansion gate region are of the first conduction type, includes: injecting ions with the first conduction type into an upper surface of a portion of the first expansion gate region in the secondary trench to form a fourth expansion gate region, where the fourth expansion gate region is connected to the second expansion gate region.

The trench-type DMOS device includes the expansion gate layer disposed on the inner surface of the gate insulation layer, and the expansion gate layer includes the first expansion gate region with the second conduction type, the second expansion gate region with the first conduction type, and the third expansion gate region with the first conduction type, which can significantly improve a contradiction relationship between voltage resistance and specific Rdson of the trench-type DMOS device. Therefore, the trench-type DMOS device has both high voltage resistance and low specific Rdson.

The trench-type DMOS device has a longitudinal voltage resistance structure, which reduces device area and further decreases device Rdson. At the same time, the source region and the drain region in the trench-type DMOS device may be led out on its front surface, which is compatible with CMOS.

BRIEF DESCRIPTION OF THE DRAWINGS

In order to illustrate the technical solutions in the embodiments of the present application or traditional technologies more clearly, the accompanying drawings required for description of the embodiments or the traditional technologies will be briefly introduced below. Apparently, the drawings in the following description are only some examples of the present application. For those of ordinary skill in the art, other drawings can be obtained from these drawings without creative efforts.

DETAILED DESCRIPTION OF THE EMBODIMENTS

Figure 1A:
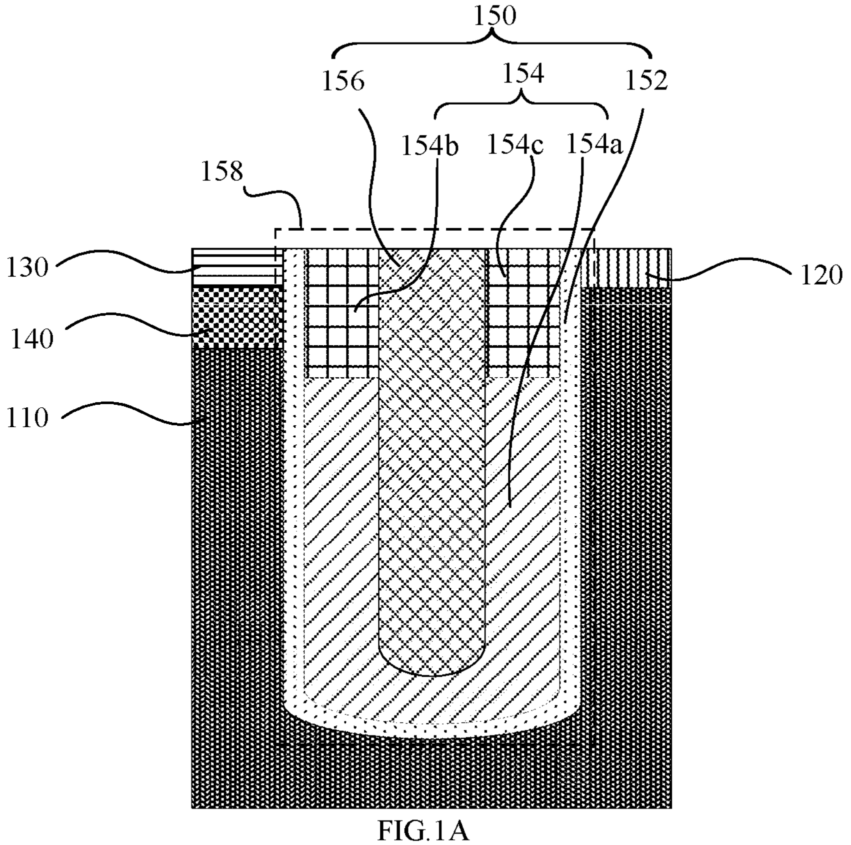
FIG. 1A is a schematic diagram illustrating a cross-sectional structure of a trench-type VDMOS device according to an embodiment.

In order to facilitate the understanding of the present application, more comprehensive description of the application will be provided below with reference to the relevant drawings. Embodiments of the present application are given in the accompanying drawings. However, the application may be implemented in many different forms, which are not limited to the embodiments described herein. On the contrary, the purpose of providing these embodiments is to make the disclosure of the application more thorough and comprehensive.

Unless otherwise defined, all technical and scientific terms used herein have the same meanings as those commonly understood by those of ordinary skill in the art to which the present application belongs. The terms used in the specification of the present application are only for the purpose of describing specific embodiments and are not intended to limit the application.

It should be understood that, when a component or layer is referred to as being "on" "adjacent to", "connected to" or "coupled to" another component or layer, it may be directly on, adjacent to, connected to, or coupled to other component or layer, or there may be an intermediate component or layer. On the contrary, when a component is referred to as being "directly on", "directly adjacent to", "directly connected to", or "directly coupled to" another component or layer, there is no intermediate component or layer. It should be understood that, although the terms "first", "second", "third", etc. may be used to describe various components, elements, regions, layers, doping types and/or parts, these components, elements, regions, layers, doping types and/or parts should not be limited by these terms. These terms are used only to distinguish one component, element, region, layer, doping type or part from another component, element, region, layer, doping type or part. Therefore, without departing from the teachings of the present disclosure, the first component, element, region, layer, doping type or part discussed below may be expressed as the second component, element, region, layer or part. For example, the first doping type may be expressed as the second doping type, and similarly, the second doping type may be expressed as the first doping type. The first doping type and the second doping type are different doping types. For example, the first doping type may be a P-type, and the second doping type may be an N-type, or the first doping type may be an N-type, and the second doping type may be a P-type.

Spatial relationship terms such as "below", "under", "at a bottom of", "above", "on", "at atop of", etc. may be used herein to describe a relationship between a component or feature and other component or feature shown in the drawings. It should be understood that, in addition to the orientations shown in the drawings, the spatial relationship terms further include different orientations of devices in use and operation. For example, if a device in the drawings is flipped, a component or feature described to be "below" or "under" or "at a bottom of" another component will be oriented to be "on" other component or feature. Therefore, the exemplary terms "below" and "under" may include both upper and lower orientations. Furthermore, the device may include additional orientations (such as rotation by 90 degrees or other orientations), and the spatial description words used herein are explained correspondingly.

Singular forms such as "a", "one" and "the/said" used herein may include plural forms, unless clearly indicated otherwise in the context. It should be understood that the terms "including/comprising" or "having", etc. indicate the existence of the stated features, entireties, steps, operations, components, parts or their combinations, but do not exclude the possibility of the existence or addition of one or more other features, entireties, steps, operations, components, parts or their combinations. At the same time, in the specification, the terms "and/or" include any and all combinations of associated listed items.

Here, the embodiments of the present disclosure are described with reference to cross-sectional views of schematic diagrams illustrating ideal embodiments (and intermediate structures) of the present disclosure, so as to anticipate changes in shown shapes due to, for example, manufacturing technologies and/or tolerances. Therefore, the embodiments of the present disclosure should not be limited to specific shapes of regions shown here, but rather include shape deviations due to, for example, manufacturing technologies. For example, injection regions displayed as rectangles typically have circular or curved features and/or injection concentration gradients at their edges, instead of binary changes from injection regions to non-injection regions. Similarly, burial regions formed by injecting may lead to some injections in regions between the burial regions and surfaces through which injection passes. Therefore, the regions shown in the drawings are essentially schematic, and their shapes do not represent actual shapes of regions in the device, and are not intended to limit the scope of the present disclosure.

Generally, VDMOS (Vertical Double diffusion Metal Oxide Semiconductor) cannot be compatible with a CMOS technology due to its drain region being led out of its back surface. Therefore, VDMOS is rarely used in BCD development. In view of this, the present application provides a trench-type DMOS device. The trench-type DMOS device can achieve extremely low Rdson device performance by utilizing the advantage of a longitudinal drift region, and the trench-type DMOS device is compatible with the CMOS technology due to its drain region being led out of its front surface, further reducing circuit area.

Figure 1B:
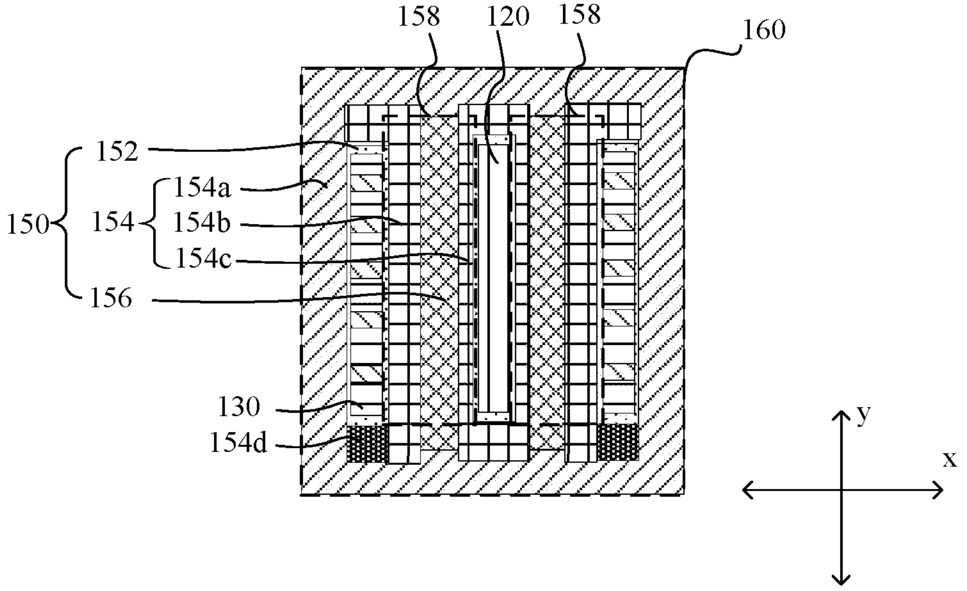
FIG. 1B is a schematic diagram illustrating a top view structure of a trench-type VDMOS device according to an embodiment.

FIG. 1A is a schematic diagram illustrating a cross-sectional structure of a trench-type DMOS device according to an embodiment of the present application. FIG. 1B is a schematic diagram illustrating a top view structure of a trench-type DMOS device according to an embodiment of the present application. As shown in FIGS. 1A to 1B, the trench-type DMOS device includes a drift region 110 with a first conduction type, a drain region 120 with the first conduction type, a source region 130 with the first conduction type, a base region 140 with a second conduction type, and a trench expansion gate 150. The trench expansion gate 150 includes a gate insulation layer 152, an expansion gate layer 154, and an insulating dielectric region 156. The expansion gate layer 154 includes a first expansion gate region 154*a* with the second conduction type, a second expansion gate region 154*b* with the first conduction type, and a third expansion gate region 154*c* with the first conduction type.

Continuously referring to FIG. 1B, a main trench 158 is provided in the drift region. The drain region 120 and the source region 130 are disposed on an upper surface of the drift region 110, and the drain region 120 and the source region 130 are disposed at different sides of the main trench 158. The base region 140 is disposed in the drift region 110, and the base region 140 is in contact with and surrounds the source region 130. The gate insulation layer 152 covers a bottom wall and side walls of the main trench 158, the expansion gate layer 154 covers a surface of the gate insulation layer 152, and the insulating dielectric region 156 covers the expansion gate layer 154 and fully fills the main trench 158. Specifically, the second expansion gate region 154*b* is disposed on a surface of the gate insulation layer 152 on a side wall of the main trench 158 near the source region 130, the third expansion gate region 154*c* is disposed on a surface of the gate insulation layer 152 on a side wall of the main trench 158 near the drain region 120, and the first expansion gate region 154*a* is disposed on a surface of the gate insulation layer 152 on the bottom wall of the main trench 158, and extends to be adjacent to the second expansion gate region 154*b* and the third expansion gate region 154*c* along the surface of the gate insulation layer 152. An interface between the first expansion gate region 154*a* and the second expansion gate region 154*b* is located on a same horizontal plane as a lower boundary of the base region 140, or the interface between the first expansion gate region 154*a* and the second expansion gate region 154*b* is lower than the lower boundary of the base region 140, so that a projection of the base region 140 and a projection of the second expansion gate region 154*b* in a depth direction (third direction) of the main trench 158 at least partially overlap, and the second expansion gate region 154*b* causes the base region 140 to invert and form a channel. It should be noted that the second expansion gate region 154*b* with the first conduction type, the first expansion gate region 154*a* with the second conduction type, and the third expansion gate region 154*c* with the first conduction type form a JFP (Junction Field Plate) structure, where the second expansion gate region 154*b* with the first conduction type further serves as a gate structure of the trench-type DMOS device. It may be understood that the first conduction type and the second conduction type are different conduction types. Optionally, the first conduction type is N-type, and the second conduction type is P-type. Optionally, the first conduction type is P-type, and the second conduction type is N-type.

In an embodiment, the gate insulation layer 152 is a gate oxide layer. The gate insulation layer 152 may include traditional dielectric materials such as oxides, nitrides, and nitrogen oxides of silicon with dielectric constants ranging from about 4 to about 20 (measured in vacuum), or the gate insulation layer 152 may include dielectric materials with typically higher dielectric constants ranging from about 20 to at least about 100. The dielectric materials with higher dielectric constants may include, but are not limited to: hafnium oxide, hafnium silicate, titanium oxide, barium strontium titanate (BST), and lead zirconate titanate (PZT). In an embodiment, a thickness of the gate insulation layer 152 ranges from 200 to 600 angstroms. Optionally, the thickness of the gate insulation layer 152 is 400 angstroms.

In an embodiment, a material for the insulating dielectric region 156 may be silicon dioxide.

In an embodiment, a width of the main trench 158 in a second direction x on an upper surface of the drift region 110 ranges from 4000 to 10000 angstroms. Optionally, the width of the main trench 158 in the second direction x on the upper surface of the drift region 110 is 6000 angstroms. The second direction x is a direction of a connection line between the source region 130 and the drain region 120, and the second direction x is parallel to the upper surface of the drift region 110. In an embodiment, a depth of the main trench 158 in a third direction ranges from 16000 to 40000 angstroms. Optionally, the depth of the main trench 158 in the third direction is 20000 angstroms. The third direction is a direction perpendicular to the upper surface of the drift region 110. In an embodiment, a thickness of the expansion gate layer 154 ranges from 1000 to 3000 angstroms. Optionally, the thickness of the expansion gate layer 154 is 2000 angstroms. In an embodiment, a length of the second expansion gate region 154*b* in the third direction ranges from 3000 to 5000 angstroms. Optionally, the length of the second expansion gate region 154*b* in the third direction is 4000 angstroms. In an embodiment, a length of the third expansion gate region 154*c* in the third direction ranges from 2000 to 6000 angstroms. Optionally, the length of the third expansion gate region 154*c* in the third direction is 4000 angstroms. In an embodiment, the length of the second expansion gate region 154*b* and the length of the third expansion gate region 154*c* in the third direction are equal. In an embodiment, the first expansion gate region 154*a* may be polycrystalline silicon with the second conduction type, and the second expansion gate region 154*b* and the third expansion gate region 154*c* may be polycrystalline silicon with the first conduction type.

In an embodiment, a first direction on the upper surface of the drift region 110 refers to a first direction within a horizontal plane where the upper surface of the drift region 110 is located, and the second direction x on the upper surface of the drift region 110 refers to a second direction x within the horizontal plane where the upper surface of the drift region 110 is located. Within the horizontal plane where the upper surface of the drift region 110 is located, the second direction is a direction of the connection line between the source region and the drain region, and the first direction and the second direction are different directions. In an embodiment, the first direction is perpendicular to the second direction.

The trench-type DMOS device provided in the above embodiment has the JFP structure. When the trench-type DMOS device conducts forward, a charge accumulation layer is formed in the drift region to reduce Rdson. Rdson is determined by charge accumulation in the drift region, and an intensity of the charge accumulation depends on a voltage applied to a gate electrode and a thickness of the expansion gate layer, and is unrelated to a doping concentration for the drift region, so as to break the law that Rdson of conventional power MOSFET depends on the doping concentration for the drift region. At the same time, a majority of current flows through the charge accumulation layer, and only a small portion of current flows through the drift region, so that the temperature distribution of the device is more uniform, and the operation of the device is more stable. In addition, when the trench-type DMOS device is in a turn-off state, the JFP structure may assist in adjusting the electric field distribution in the drift region, taking a certain effect on increasing the voltage resistance of the trench-type DMOS device, and significantly improving the contradiction relationship between the voltage resistance and specific Rdson of the trench-type DMOS device.

The trench-type DMOS device provided in the above embodiment has a longitudinal voltage resistance structure, which reduces device area and further decreases device Rdson. At the same time, the drain region and the source region in the trench-type DMOS device are disposed on a same surface of the device, and the source region and the drain region in the trench-type DMOS device may be led out on its front surface, which is compatible with CMOS.

FIG. 1B is a schematic diagram illustrating a top view structure of a trench-type DMOS device according to an embodiment of the present application. As shown in FIG. 1B, the trench-type DMOS device may further include a secondary trench 160. Specifically, the secondary trench 160 is located in the drift region, and is in communication with the main trench 158. The secondary trench 160 is provided with the second expansion gate region 154*b*, and a fourth expansion gate region 154*d* with the second conduction type connected to the second expansion gate region 154*b*. The second expansion gate region 154*b* disposed in the secondary trench 160 is connected to the second expansion gate region 154*b* disposed in the main trench 158. The secondary trench 160 provided in the drift region may be used to accommodate a portion of JFP. It should be noted that the second expansion gate region 154*b*, the fourth expansion gate region 154*d*, the first expansion gate region 154*a*, and the third expansion gate region 154*c* form a JFP structure.

In an embodiment, a length of the second expansion gate region 154*b* disposed in the secondary trench 160 in the third direction is greater than that of the fourth expansion gate region 154*d* disposed in the secondary trench 160 in the third direction. In an embodiment, the secondary trench 160 is provided with the first expansion gate region 154*a*, and the first expansion gate region 154*a* is in contact with the second expansion gate region 154*b* and the fourth expansion gate region 154*d* disposed in the secondary trench 160, and is connected to the first expansion gate region 154*a* disposed in the main trench 158. In an embodiment, a doping concentration for the fourth expansion gate region 154*d* is greater than that for the first expansion gate region 154*a*. In an embodiment, a width of the secondary trench 160 in the first direction y on the upper surface of the drift region ranges from 3000 to 5000 angstroms. Optionally, the width of the secondary trench 160 in the first direction y on the upper surface of the drift region is 4000 angstroms.

In an embodiment, on the upper surface of the drift region 110, the main trench 158 and the secondary trench 160 form a "日" shaped structure or a comb-like structure. The "日" shaped structure includes a rectangular frame portion and a "_" shaped portion, where the main trench 158 serves as the "_" shaped portion in the "日" shaped structure, and the secondary trench 160 serves as the rectangular frame portion in the "凵" shaped structure. The comb-like structure includes a comb tooth portion and a comb handle portion connected to the comb tooth portion, where the main trench 158 serves as the comb tooth portion in the comb-like structure, and the secondary trench 160 serves as the comb handle portion in the comb-like structure.

Figure 2A:
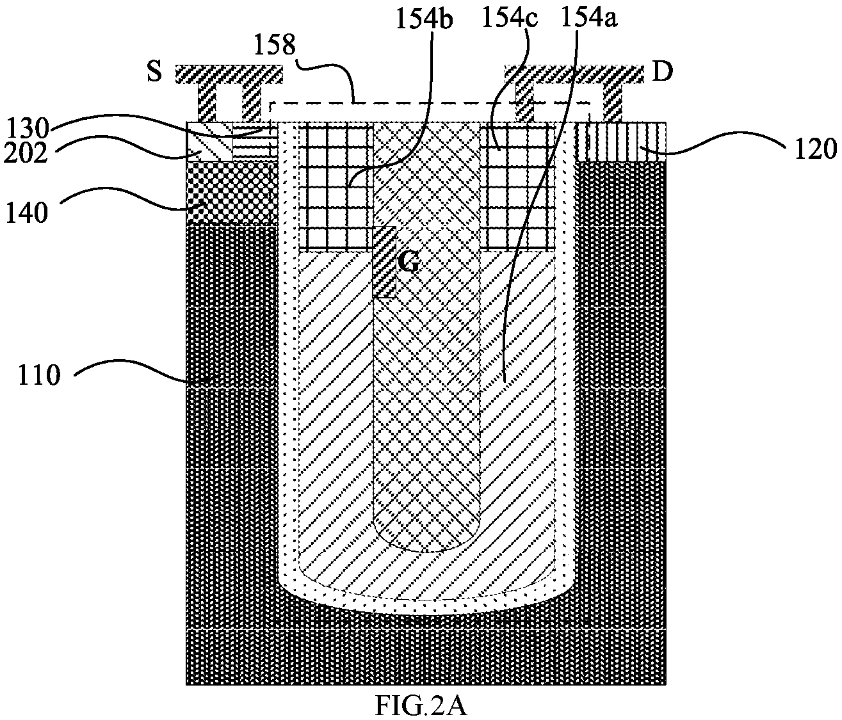
FIG. 2A is a schematic diagram illustrating a cross-sectional structure of a trench-type VDMOS device according to another embodiment.
Figure 2B:
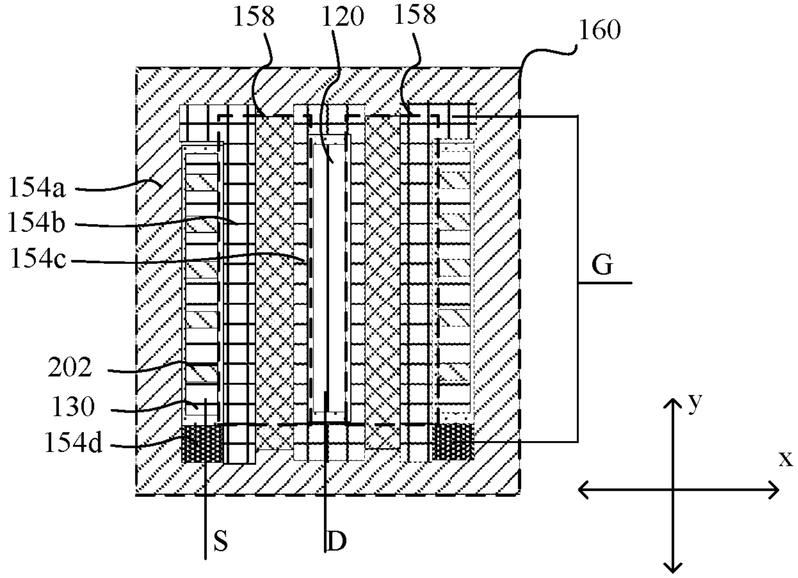
FIG. 2B is a schematic diagram illustrating a top view structure of a trench-type VDMOS device according to another embodiment.

Referring to FIGS. 2A to 2B, the trench-type DMOS device may further include a drain electrode D, a source electrode S, and a gate electrode G. The drain electrode D is electrically connected to the drain region 120 and the third expansion gate region 154*c*, the source electrode S is electrically connected to the source region 130, and the gate electrode G is electrically connected to the second expansion gate region 154*b* and the fourth expansion gate region 154*d*. It should be noted that the gate electrode G shown in FIG. 2A is only illustrative, indicating that a gate voltage is added here, and an actual external lead-out method of the gate electrode G is a method as shown in FIG. 2B. In an embodiment, the gate electrode G is in contact with the second expansion gate region 154*b* and the fourth expansion gate region 154*d* disposed in the secondary trench 160 to achieve electrical connection of the gate electrode G to the second expansion gate region 154*b* and the fourth expansion gate region 154*d*. Generally speaking, in order to improve utilization, a size of the second expansion gate region 154*b* in the main trench 158 in the second direction x is smaller. In a case of drilling a hole (providing a gate through hole on the dielectric layer covering the second expansion gate region 154*b*) to lead out the gate electrode, since there are size requirements for drilling the hole, by providing the secondary trench 160, and providing the second expansion gate region 154*b* and the fourth expansion gate region 154*d* in the secondary trench 160, a contradiction relationship between drilling and utilization may be effectively solved. In an embodiment, the second expansion gate region 154*b* is of an N-type, and the fourth expansion gate region 154*d* is of a P-type. According to the trench-type DMOS device provided in this embodiment, it may be ensured that, while NDMOS is an N-type gate region, a potential of the first expansion gate region 154*a* is the same as that of the gate electrode, which ensures the effect of the JFP structure. In an embodiment, the gate electrode is connected to a zero potential.

Continuously referring to FIGS. 2A and 2B, the trench-type DMOS device may further include a base region lead-out region 202 with the second conduction type. It should be noted that a position for disposing the base region lead-out region 202 in FIG. 2A is only illustrative, and an actual position for disposing the base region lead-out region 202 is a position for disposing the base region lead-out region 202 shown in FIG. 2B. The base region lead-out region 202 is located on an upper surface of the base region 140. The base region lead-out region 202 is electrically connected to the source electrode S. The base region lead-out region 202 is connected to the source region 130 in the first direction y on the upper surface of the drift region 110. It may be understood that the first direction y and the second direction x are different directions. In an embodiment, a doping concentration for the base region lead-out region 202 is greater than that for the base region 140. In this embodiment, an effect of the JFP structure on Resurf (Reducing Surface Field) is achieved by short connecting the source region 130 and the base region lead-out region 202 together.

Figure 3:
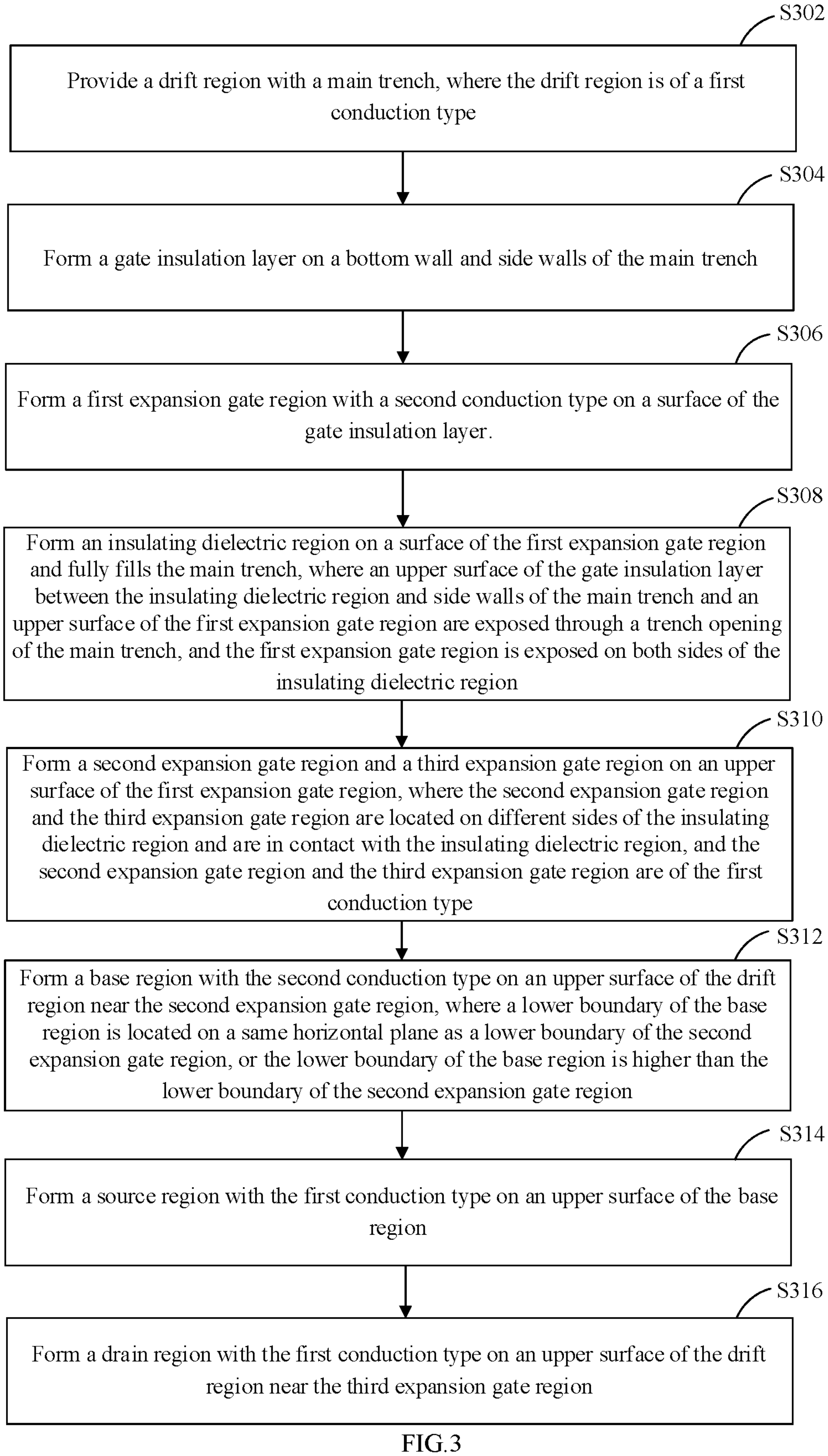
FIG. 3 is a flowchart illustrating a method for manufacturing a trench-type VDMOS device according to an embodiment.

FIG. 3 is a flowchart illustrating a method for manufacturing a trench-type DMOS device according to an embodiment of the present application. As shown in FIG. 3, the method for manufacturing a trench-type DMOS device may include steps S302 to S312.

At S302, a drift region with a main trench is provided, where the drift region is of a first conduction type.

Figure 4A:
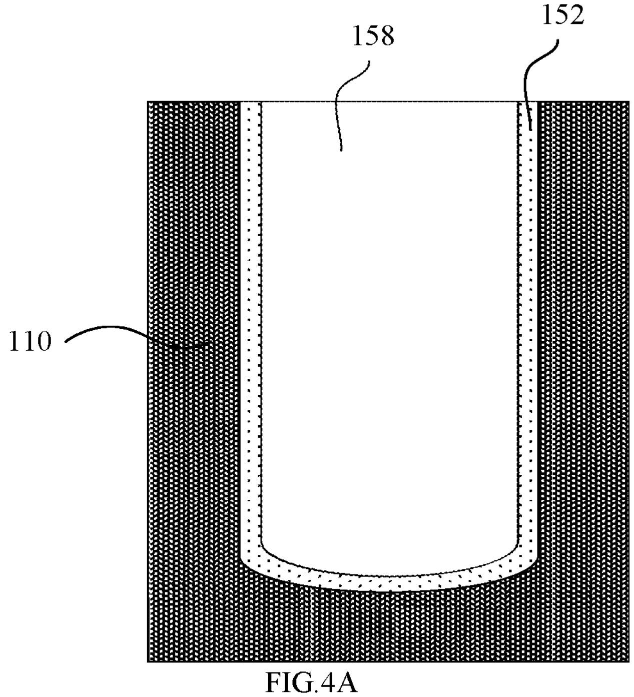
FIG. 4A is a schematic diagram illustrating a cross-sectional structure of a structure obtained in a step of forming a gate insulation layer on a bottom wall and side walls of a main trench in a method for manufacturing a trench-type VDMOS device according to an embodiment.
Figure 4B:
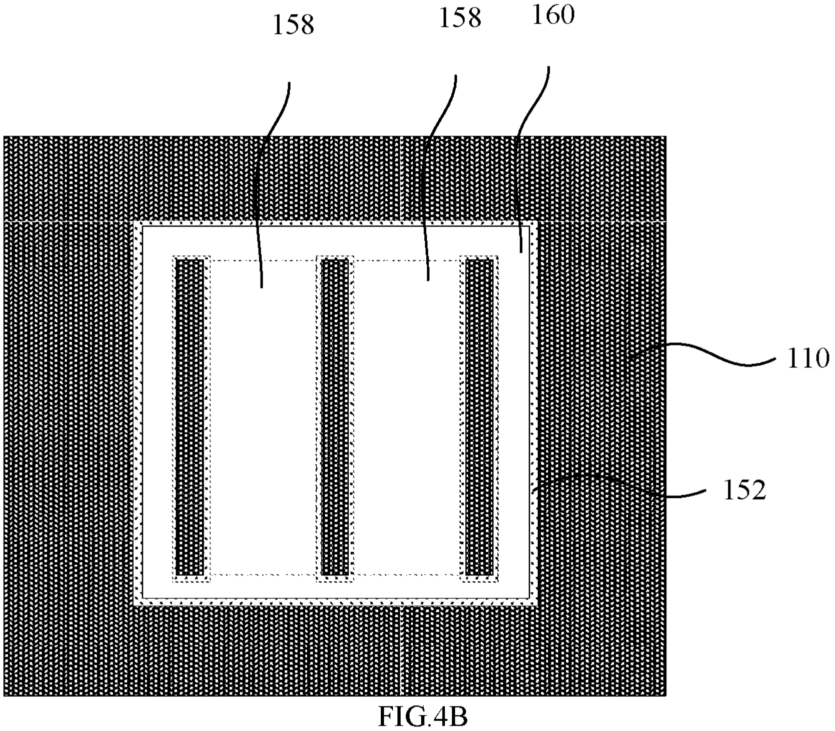
FIG. 4B is a schematic diagram illustrating atop view structure of a structure obtained in a step of forming a gate insulation layer on a bottom wall and side walls of a main trench in a method for manufacturing a trench-type VDMOS device according to an embodiment.

FIG. 4A is a schematic diagram illustrating a cross-sectional structure of a drift region with a main trench. FIG. 4B is a schematic diagram illustrating a top view structure of a drift region with a main trench. In an embodiment, the drift region 110 is disposed on an upper surface of a substrate with the second conduction type. A width of the main trench 158 in the second direction may range from 4000 to 10000 angstroms. A depth of the main trench 158 in the third direction may range from 16000 to 40000 angstroms. The bottom wall of the main trench 158 is of an arc shape. In an embodiment, the drift region 110 is provided with at least one main trench 158.

In an embodiment, before the step of providing the drift region with the main trench, the method includes: etching the drift region to form the main trench. In an embodiment, before the step of etching the drift region to form the main trench, the method includes: providing a substrate with a second conduction type, and forming the drift region on an upper surface of the substrate. The substrate includes a semiconductor substrate, and undoped monocrystalline silicon, monocrystalline silicon doped with impurities, Silicon on Insulator (SOI), Stacked Silicon on Insulator (SSOI), Stacked Silicon Germanium on Insulator (S-SiGeOI), Silicon Germanium on Insulator (SiGeOI), Germanium on Insulator (GeOI), etc. may be used as materials for the substrate. The step of etching the drift region to form the main trench may include: forming a mask layer on a surface of the drift region; patterning the mask layer to obtain a patterned mask layer, where the patterned mask layer has an opening, which exposes the drift region and defines a shape and a position of the main trench; etching the drift region based on the patterned mask layer to form the main trench in the drift region. In an embodiment, the mask layer is a hard mask layer. In an embodiment, the hard mask layer has a film layer structure of oxide/SiN/oxide.

At S304, a gate insulation layer is formed on a bottom wall and side walls of the main trench.

Continuously referring to FIGS. 4A to 4B, the gate insulation layer 152 is formed on the bottom wall and the side walls of the main trench 158. In an embodiment, a thickness of the gate insulation layer 152 may range from 200 to 600 angstroms. Optionally, the thickness of the gate insulation layer 152 may be 400 angstroms. In an embodiment, the gate insulation layer 152 may be a gate oxide layer. The gate insulation layer 152 may include traditional dielectric materials such as oxides, nitrides, and nitrogen oxides of silicon with dielectric constants ranging from about 4 to about 20 (measured in vacuum), or the gate insulation layer 152 may include dielectric materials with typically higher dielectric constants ranging from about 20 to at least about 100. The dielectric materials with higher dielectric constants may include, but are not limited to: hafnium oxide, hafnium silicate, titanium oxide, barium strontium titanate (BST), and lead zirconate titanate (PZT).

At S306, a first expansion gate region with a second conduction type is formed on a surface of the gate insulation layer.

Figure 5A:
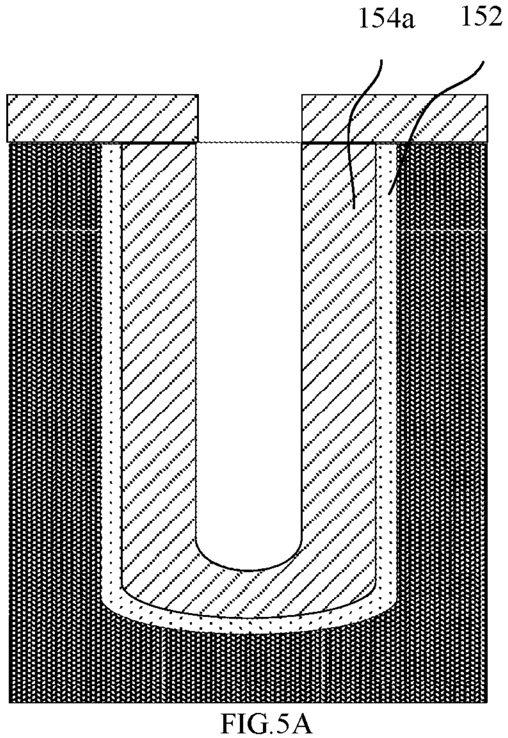
FIG. 5A is a schematic diagram illustrating a cross-sectional structure of a structure obtained in a step of forming a first expansion gate region with a second conduction type on a surface of a gate insulation layer in a method for manufacturing a trench-type VDMOS device according to an embodiment.
Figure 5B:
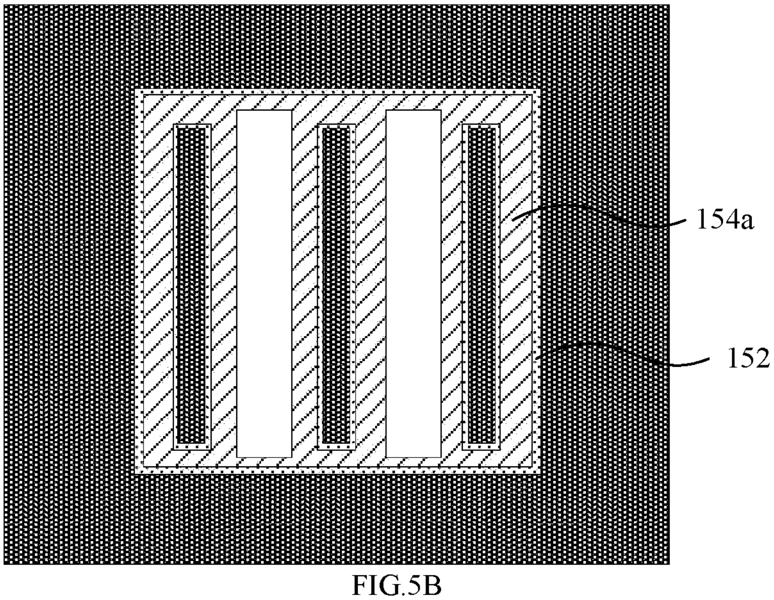
FIG. 5B is a schematic diagram illustrating atop view structure of a structure obtained in a step of forming a first expansion gate region with a second conduction type on a surface of a gate insulation layer in a method for manufacturing a trench-type VDMOS device according to an embodiment.

Referring to FIGS. 5A to 5B, the first expansion gate region 154*a* is formed on the surface of the gate insulation layer 152. It should be noted that the second conduction type is a conduction type different from the first conduction type. In an embodiment, a thickness of the first expansion gate region 154*a* may range from 1000 to 3000 angstroms. Optionally, the thickness of the first expansion gate region 154*a* may be 2000 angstroms.

In an embodiment, the step of forming the first expansion gate region with the second conduction type on the surface of the gate insulation layer may include: forming polycrystalline silicon with the second conduction type as the first expansion gate region on the surface of the gate insulation layer. It should be noted that, after the first expansion gate region with the second conduction type is formed on the surface of the gate insulation layer, a depression is left in the middle of the main trench. In an embodiment, the step of forming the first expansion gate region with the second conduction type on the surface of the gate insulation layer includes: depositing a layer of polycrystalline silicon with the second conduction type by using a furnace tube to form the first expansion gate region with the second conduction type.

At S308, an insulating dielectric region is formed on a surface of the first expansion gate region and fully fills the main trench, where an upper surface of the gate insulation layer between the insulating dielectric region and side walls of the main trench and an upper surface of the first expansion gate region are exposed through a trench opening of the main trench, and the first expansion gate region is exposed on both sides of the insulating dielectric region.

Figure 6:
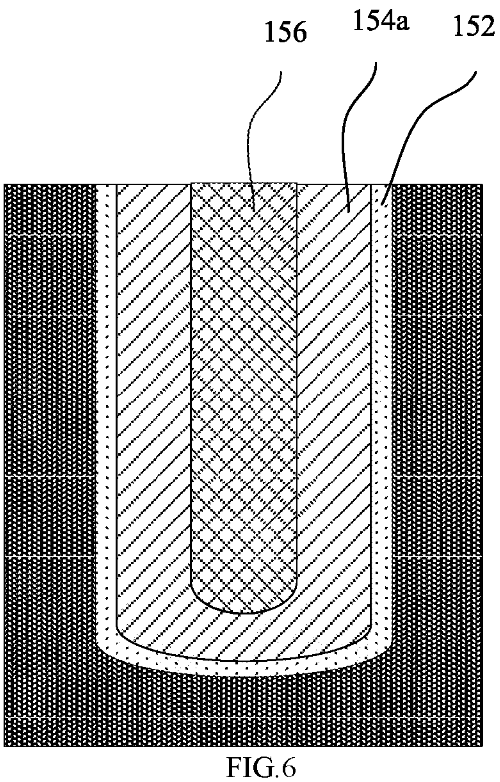
FIG. 6 is a schematic diagram illustrating a cross-sectional structure of a structure obtained in a step of forming an insulating dielectric region on a surface of a first expansion gate region and fully filling a main trench in a method for manufacturing a trench-type VDMOS device according to an embodiment.

Referring to FIG. 6, the insulating dielectric region 156 is formed on the surface of the first expansion gate region 154*a* and fully fills the main trench. An upper surface of the gate insulation layer 152 between the insulating dielectric region 156 and the side walls of the main trench and an upper surface of the first expansion gate region 154*a* are exposed through a trench opening of the main trench, and the first expansion gate region 154*a* is exposed on two sides of the insulating dielectric region 156. In an embodiment, materials for the insulating dielectric region 156 may include silicon dioxide.

In an embodiment, the step of forming the insulating dielectric region on the surface of the first expansion gate region includes: fully filling the depression of the main trench by using an HDP (high-density plasma) process. It may be understood that the HDP process has both deposition and etching capabilities, so as to have a good trench filling capability.

In an embodiment, after the step of forming the insulating dielectric region on the surface of the first expansion gate region and fully filling the main trench, the method further includes: etching the insulating dielectric region to the surface of the drift region. After the step of etching the insulating dielectric region to the surface of the drift region, the method further includes: etching the first expansion gate region to the surface of the drift region, so that the upper surface of the gate insulation layer between the insulating dielectric region and the side walls of the main trench and the upper surface of the first expansion gate region are exposed through the trench opening of the main trench, and the first expansion gate region is exposed on both sides of the insulating dielectric region.

At S310, a second expansion gate region and a third expansion gate region are formed on an upper surface of the first expansion gate region, where the second expansion gate region and the third expansion gate region are located on different sides of the insulating dielectric region and are in contact with the insulating dielectric region, and the second expansion gate region and the third expansion gate region are of the first conduction type.

Figure 7A:
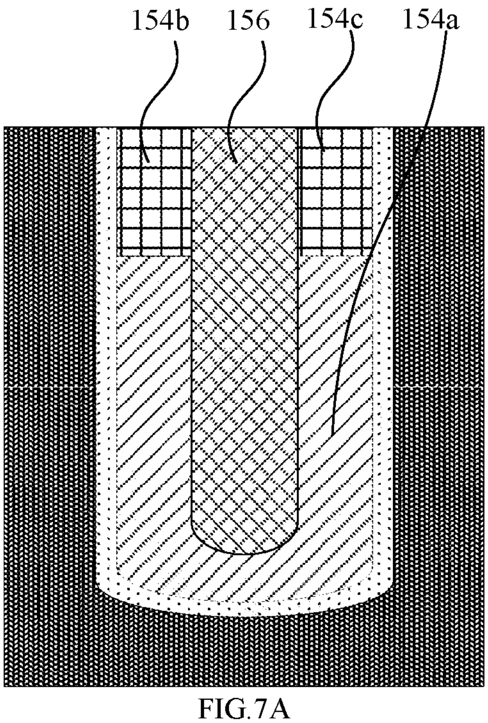
FIG. 7A is a schematic diagram illustrating a cross-sectional structure of a structure obtained in a step of forming a second expansion gate region and a third expansion gate region on an upper surface of a first expansion gate region in a method for manufacturing a trench-type VDMOS device according to an embodiment.
Figure 7B:
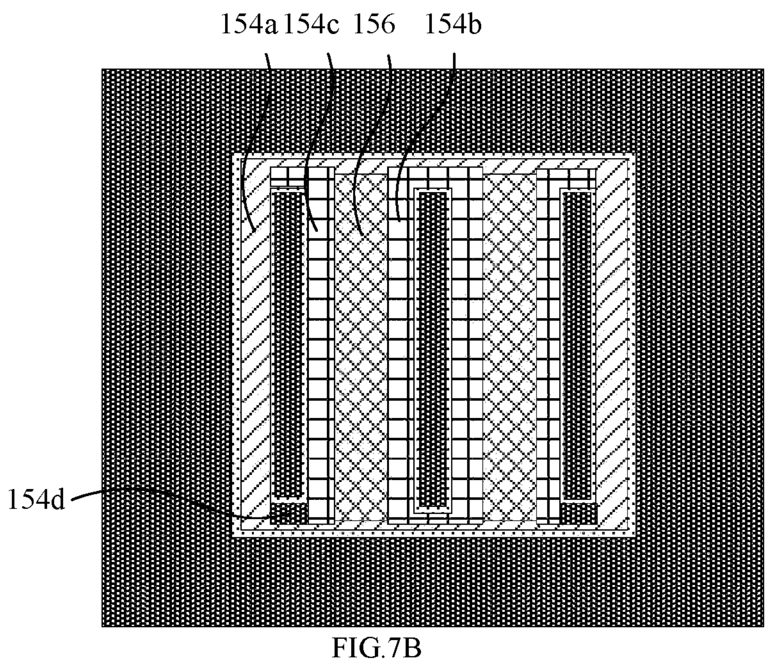
FIG. 7B is a schematic diagram illustrating atop view structure of a structure obtained in a step of forming a second expansion gate region and a third expansion gate region on an upper surface of a first expansion gate region in a method for manufacturing a trench-type VDMOS device according to an embodiment.

Referring to FIGS. 7A to 7B, the formed second expansion gate region 154*b* and third expansion gate region 154*c* are located on different sides of the insulating dielectric region 156 and are in contact with the insulating dielectric region 156. It should be noted that the second expansion gate region 154*b* and the third expansion gate region 154*c* are of the first conduction type. In an embodiment, a depth of the second expansion gate region 154*b* and a depth of the third expansion gate region 154*c* penetrating into the main trench are same. In an embodiment, the depth of the second expansion gate region 154*b* and the depth of the third expansion gate region 154*c* penetrating into the main trench range from 3000 to 5000 angstroms. Optionally, the depth of the second expansion gate region 154*b* and the depth of the third expansion gate region 154*c* penetrating into the main trench are 4000 angstroms.

In an embodiment, the step of forming the second expansion gate region and the third expansion gate region on the upper surface of the first expansion gate region may include: injecting ions with the first conduction type into the upper surface of the first expansion gate region exposed through the trench opening of the main trench to form the second expansion gate region on a side of the insulating dielectric region and form the third expansion gate region on another side of the insulating dielectric region.

At S312, a base region with the second conduction type is formed on an upper surface of the drift region near the second expansion gate region, where a lower boundary of the base region is located on a same horizontal plane as a lower boundary of the second expansion gate region, or the lower boundary of the base region is higher than the lower boundary of the second expansion gate region.

Figure 8:
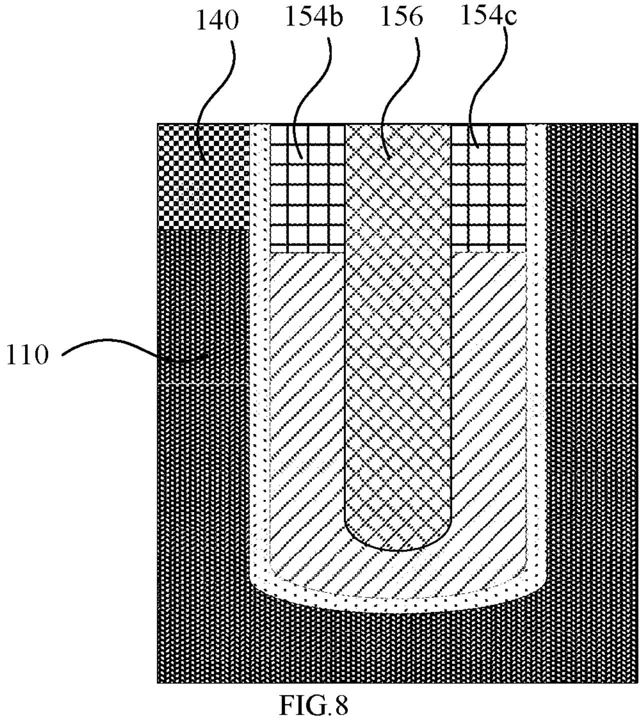
FIG. 8 is a schematic diagram illustrating a cross-sectional structure of a structure obtained in a step of forming a base region with a second conduction type on an upper surface of a drift region near a second expansion gate region in a method for manufacturing a trench-type VDMOS device according to an embodiment.

Referring to FIG. 8, the base region 140 is formed on the upper surface of the drift region 110 near the second expansion gate region 154*b*. It should be noted that the lower boundary of the base region 140 is located on the same horizontal plane as the lower boundary of the second expansion gate region 154*b*, or the lower boundary of the base region 140 is higher than the lower boundary of the second expansion gate region 154*b*.

In an embodiment, the step of forming the base region with the second conduction type on the upper surface of the drift region near the second expansion gate region includes: forming the base region with the second conduction type on the upper surface of the drift region near the second expansion gate region by photoetching and injecting ions with the second conduction type.

At S314, a source region with the first conduction type is formed on an upper surface of the base region.

Referring to FIGS. 1A and 1B, the source region 130 is formed on the upper surface of the base region 140.

In an embodiment, the step of forming the source region with the first conduction type on the upper surface of the base region may include: forming the source region by photoetching and injecting ions with the first conduction type.

At S316, a drain region with the first conduction type is formed on an upper surface of the drift region near the third expansion gate region.

Continuously referring to FIGS. 1A and 1B, the drain region 120 is formed on the upper surface of the drift region 110 near the third expansion gate region 154*c*.

In an embodiment, the step of forming the drain region with the first conduction type on the upper surface of the drift region near the third expansion gate region may include: forming the drain region by photoetching and injecting ions with the first conduction type. In an embodiment, the source region and the drain region are formed simultaneously.

In an embodiment, the method for manufacturing the trench-type DMOS device may further include: forming a base region lead-out region with the second conduction type on the upper surface of the base region, where the base region lead-out region is connected to the source region in the first direction on the upper surface of the drift region. In an embodiment, the step of forming the base region lead-out region with the second conduction type on the upper surface of the drift region includes: forming the base region lead-out region by photoetching and injecting ions with the second conduction type.

In an embodiment, the method for manufacturing the trench-type DMOS device may further include: forming a source electrode, where the source electrode is electrically connected to the source region and the base region lead-out region. In an embodiment, the method for manufacturing the trench-type DMOS device may further include: forming a drain electrode, where the drain electrode is electrically connected to the drain region and the third expansion gate region.

The layout of the method for manufacturing the trench-type VDMOS device provided in the embodiments of the present application is relatively simple, and the manufacturing method therefor is also relatively simple, reducing production cost. Moreover, the trench-type DMOS device manufactured according to the method for manufacturing the trench-type DMOS device in the embodiments of the present application can achieve extremely low Rdson device performance by utilizing the advantage of a longitudinal drift region, and the trench-type DMOS device is compatible with the CMOS technology due to its drain region being led out of its front surface, further reducing circuit area.

Figure 9:
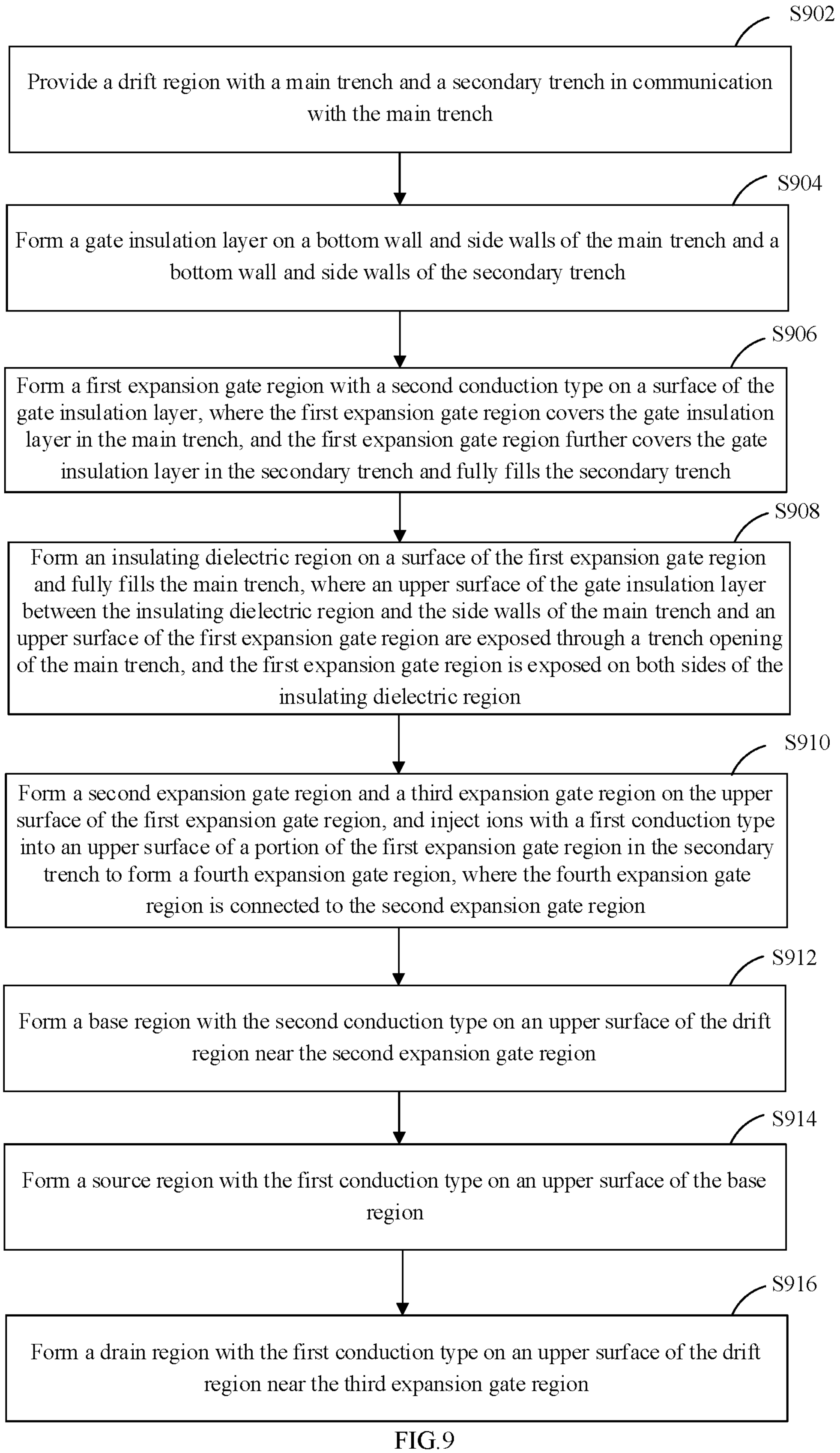
FIG. 9 is a flowchart illustrating a method for manufacturing a trench-type VDMOS device according to another embodiment.

FIG. 9 shows a method for manufacturing a trench-type VDMOS device according to an embodiment of the present application. As shown in FIG. 9, the method for manufacturing the trench-type VDMOS device may include steps S902 to S912.

At S902, a drift region with a main trench and a secondary trench in communication with the main trench are provided.

Continuously referring to FIG. 4B, the drift region 110 is provided with the main trench 158 and the secondary trench 160 connected to the main trench 158. In an embodiment, a width of the main trench 158 in the second direction is greater than that of the secondary trench 160 in the first direction.

At S904, a gate insulation layer is formed on a bottom wall and side walls of the main trench and a bottom wall and side walls of the secondary trench.

Continuously referring to FIG. 4B, the gate insulation layer 152 is formed on the bottom wall and the side walls of the main trench 158 and the bottom wall and the side walls of the secondary trench 160. For details of the description of the formed gate insulation layer 152, reference may be made to the above embodiments, which will not be repeated here.

In an embodiment, the gate insulation layer is formed simultaneously on the bottom wall and the side walls of the main trench and the bottom wall and the side walls of the secondary trench.

At S906, a first expansion gate region with a second conduction type is formed on a surface of the gate insulation layer, where the first expansion gate region covers the gate insulation layer in the main trench, and the first expansion gate region further covers the gate insulation layer in the secondary trench and fully fills the secondary trench.

Referring to FIG. 5B, the first expansion gate region 154*a* with the second conduction type is formed on the surface of the gate insulation layer 152. It should be noted that the first expansion gate region 154*a* covers the gate insulation layer 152 in the main trench, and the main trench is not fully filled by the first expansion gate region 154*a*. A depression is left in the middle of the main trench. At the same time, the first expansion gate region 154*a* covers the gate insulation layer 152 in the secondary trench and fully fills the secondary trench.

At S908, an insulating dielectric region is formed on a surface of the first expansion gate region and fully fills the main trench, where an upper surface of the gate insulation layer between the insulating dielectric region and the side walls of the main trench and an upper surface of the first expansion gate region are exposed through a trench opening of the main trench, and the first expansion gate region is exposed on both sides of the insulating dielectric region.

Referring to FIG. 6, the insulating dielectric region 156 is formed on the surface of the first expansion gate region 154*a* and fully fills the main trench. It should be noted that an upper surface of the gate insulation layer 152 between the insulating dielectric region 156 and the side walls of the main trench and an upper surface of the first expansion gate region 154*a* are exposed through a trench opening of the main trench, and the first expansion gate region 154*a* is exposed on both sides of the insulating dielectric region 156. The gate insulation layer 152 fully fills the depression left in the middle of the main trench.

At S910, a second expansion gate region and a third expansion gate region are formed on the upper surface of the first expansion gate region, and ions with a first conduction type are injected into an upper surface of a portion of the first expansion gate region in the secondary trench to form a fourth expansion gate region, where the fourth expansion gate region is connected to the second expansion gate region.

Referring to FIG. 7B, the second expansion gate region 154*b*, the third expansion gate region 154*c*, and the fourth expansion gate region 154*d* is formed on the upper surface of the first expansion gate region 154*a*.

In an embodiment, while the second expansion gate region and the third expansion gate region are formed on the upper surface of the first expansion gate region, the ions with the first conduction type are injected into the upper surface of a portion of the first expansion gate region in the secondary trench to form the fourth expansion gate region. In an embodiment, the ions with the first conduction type are injected into the upper surface of the first expansion gate region to form the second expansion gate region, the third expansion gate region, and the fourth expansion gate region.

At S912, a base region with the second conduction type is formed on an upper surface of the drift region near the second expansion gate region.

At S914, a source region with the first conduction type is formed on an upper surface of the base region.

At S916, a drain region with the first conduction type is formed on an upper surface of the drift region near the third expansion gate region.

For details of the description of steps S912 to S916, reference may be made to the above embodiments, which will not be repeated here.

In an embodiment, after the step of injecting the ions with the first conduction type into the upper surface of a portion of the first expansion gate region in the secondary trench to form the fourth expansion gate region, the method may further include: forming a gate electrode, where the gate electrode is connected to the second expansion gate region and the fourth expansion gate region.

It should be understood that, although the steps in the flowcharts of FIGS. 3 and 9 are displayed sequentially according to the indication of arrows, these steps are not necessarily executed in an order indicated by the arrows. Unless explicitly stated herein, there is no strict limitation on the execution order of these steps, and the steps may be executed in other order. Moreover, at least some of the steps in FIGS. 3 and 9 may include multiple steps or stages. The steps or stages may not necessarily be executed and completed at the same time, but rather be executed at different times. The execution order of these steps or stages may not necessarily be sequential. Instead, these steps or stages may be executed in turn or alternately with at least some of other steps, or steps or stages in other steps.

In the description of the specification, the description of reference terms "some embodiments", "other embodiments", "ideal embodiments", etc. refers to that specific features, structures, or materials described in conjunction with the embodiments or examples are included in at least one of the embodiments or examples of the present disclosure. In this specification, the schematic description of the above terms may not necessarily refer to the same embodiment or example.

Various technical features in the embodiments may be combined arbitrarily. In order to make the description concise, all possible combinations of the technical features in the embodiments have not been described. However, as long as there is no contradiction between the combinations of these technical features, they should be considered within the scope of the specification.

Only several examples of the present application are described in the above embodiments, and their description is more specific and detailed, but cannot be understood as a limitation on the scope of the patent application. It should be pointed out that, for those of ordinary skill in the art, some variations and improvements may be made without departing from the concept of the present application, and those variations and improvements fall within the protection scope of the present application. Therefore, the protection scope of the patent application shall be subject to the appended claims.

The invention claimed is:

1. A trench-type Double diffusion Metal Oxide Semiconductor (DMOS) device, comprising:

a drift region with a first conduction type and a main trench disposed in the drift region;

a drain region with the first conduction type and a source region with the first conduction type, wherein the drain region and the source region are disposed on an upper surface of the drift region and on different sides of the main trench;

a base region with a second conduction type disposed in the drift region, the base region being in contact with and surrounding the source region;

a trench expansion gate comprising a gate insulation layer covering a bottom wall and side walls of the main trench, an expansion gate layer covering a surface of the gate insulation layer, and an insulating dielectric region covering the expansion gate layer and fully filling the main trench, wherein the expansion gate layer comprises a first expansion gate region with the second conduction type, a second expansion gate region with the first conduction type, and a third expansion gate region with the first conduction type; the second expansion gate region is disposed on a surface of the gate insulation layer on a side wall of the main trench near the source region, the third expansion gate region is disposed on a surface of the gate insulation layer on a side wall of the main trench near the drain region, and the first expansion gate region is disposed on a surface of the gate insulation layer on the bottom wall of the main trench, and extends to be adjacent to the second expansion gate region and the third expansion gate region along the surface of the gate insulation layer; an interface between the first expansion gate region and the second expansion gate region is located on a same horizontal plane as a lower boundary of the base region, or is lower than the lower boundary of the base region; and a secondary trench, wherein the secondary trench is located in the drift region, and is in communication with the main trench, and the secondary trench is provided with the second expansion gate region, and a fourth expansion gate region with the second conduction type connected to the second expansion gate region.

2. The trench-type DMOS device according to claim 1, further comprising:

a drain electrode electrically connected to the drain region and the third expansion gate region;

a source electrode electrically connected to the source region; and a gate electrode electrically connected to the second expansion gate region and the fourth expansion gate region.

3. The trench-type DMOS device according to claim 2, further comprising:

a base region lead-out region with the second conduction type located on an upper surface of the base region with the second conduction type, wherein the base region lead-out region is electrically connected to the source electrode, and the base region lead-out region is connected to the source region in a first direction on the upper surface of the drift region; the first direction and a second direction are different directions, and the second direction is a horizontal direction along the upper surface of the drift region, pointing from the source region to the drain region.

4. The trench-type DMOS device according to claim 1, wherein a width of the main trench in a second direction on the upper surface of the drift region ranges from 4000 to 10000 angstroms, and/or a width of the secondary trench in a first direction on the upper surface of the drift region ranges from 3000 to 5000 angstroms, and/or a depth of the main trench in a third direction ranges from 16000 to 40000 angstroms, and the third direction is a direction perpendicular to the upper surface of the drift region.

5. The trench-type DMOS device according to claim 1, wherein a length of the second expansion gate region in a third direction ranges from 3000 to 5000 angstroms, and/or a length of the third expansion gate region in the third direction ranges from 2000 to 6000 angstroms, and the third direction is a direction perpendicular to the upper surface of the drift region.

6. The trench-type DMOS device according to claim 1, wherein a thickness of the expansion gate layer ranges from 1000 to 3000 angstroms.

7. The trench-type DMOS device according to claim 1, wherein the first expansion gate region is polycrystalline silicon with the second conduction type, and the second expansion gate region and the third expansion gate region are polycrystalline silicon with the first conduction type.

8. A method of manufacturing a trench-type DMOS device, comprising:

providing a drift region with a main trench, wherein the drift region is of a first conduction type;

forming a gate insulation layer on a bottom wall and side walls of the main trench;

forming a first expansion gate region with a second conduction type on a surface of the gate insulation layer;

forming an insulating dielectric region on a surface of the first expansion gate region and fully filling the main trench with the insulating dielectric region, wherein an upper surface of the gate insulation layer between the insulating dielectric region and the side walls of the main trench and an upper surface of the first expansion gate region are exposed through a trench opening of the main trench, and the first expansion gate region is exposed on both sides of the insulating dielectric region;

forming a second expansion gate region and a third expansion gate region on the upper surface of the first expansion gate region, wherein the second expansion gate region and the third expansion gate region are located on different sides of the insulating dielectric region and are in contact with the insulating dielectric region, and the second expansion gate region and the third expansion gate region are of the first conduction type;

forming a base region with the second conduction type on an upper surface of the drift region near the second expansion gate region, wherein a lower boundary of the base region is located on a same horizontal plane as a lower boundary of the second expansion gate region, or the lower boundary of the base region is higher than the lower boundary of the second expansion gate region;

forming a source region with the first conduction type on an upper surface of the base region; and forming a drain region with the first conduction type on an upper surface of the drift region near the third expansion gate region.

9. The method according to claim 8, wherein forming the first expansion gate region with the second conduction type on the surface of the gate insulation layer comprises:

forming polycrystalline silicon with the second conduction type as the first expansion gate region on the surface of the gate insulation layer.

10. The method according to claim 8, wherein forming the second expansion gate region and the third expansion gate region on the upper surface of the first expansion gate region, wherein the second expansion gate region and the third expansion gate region are located on different sides of the insulating dielectric region and are in contact with the insulating dielectric region, and the second expansion gate region and the third expansion gate region are of the first conduction type, comprises:

injecting ions with the first conduction type into the upper surface of the first expansion gate region exposed through the trench opening of the main trench to form the second expansion gate region on a side of the insulating dielectric region and form the third expansion gate region on another side of the insulating dielectric region.

11. The method according to claim 10, wherein a depth of the second expansion gate region and a depth of the third expansion gate region penetrating into the main trench range from 3000 to 5000 angstroms.

12. The method according to claim 10, wherein providing the drift region with the main trench, wherein the drift region is of the first conduction type, comprises: providing a secondary trench in communication with the main trench in the drift region, forming the gate insulation layer on the bottom wall and the side walls of the main trench, and forming the first expansion gate region with the second conduction type on the surface of the gate insulation layer comprises: forming the gate insulation layer on a bottom wall and side walls of the secondary trench, wherein, while forming the first expansion gate region on the surface of the gate insulation layer in the main trench, the first expansion gate region further covers the gate insulation layer in the secondary trench and fully fills the secondary trench.

13. The method according to claim 8, wherein a depth of the second expansion gate region and a depth of the third expansion gate region penetrating into the main trench range from 3000 to 5000 angstroms.

14. The method according to claim 8, wherein providing the drift region with the main trench, wherein the drift region is of the first conduction type, comprises: providing a secondary trench in communication with the main trench in the drift region, forming the gate insulation layer on the bottom wall and the side walls of the main trench, and forming the first expansion gate region with the second conduction type on the surface of the gate insulation layer comprises: forming the gate insulation layer on a bottom wall and side walls of the secondary trench, wherein, while forming the first expansion gate region on the surface of the gate insulation layer in the main trench, the first expansion gate region further covers the gate insulation layer in the secondary trench and fully fills the secondary trench.

15. The method according to claim 14, wherein forming the second expansion gate region and the third expansion gate region on the upper surface of the first expansion gate region, wherein the second expansion gate region and the third expansion gate region are located on different sides of the insulating dielectric region and are in contact with the insulating dielectric region, and the second expansion gate region and the third expansion gate region are of the first conduction type, comprises:

injecting ions with the first conduction type into an upper surface of a portion of the first expansion gate region in the secondary trench to form a fourth expansion gate region, wherein the fourth expansion gate region is connected to the second expansion gate region.

16. The method according to claim 14, wherein a width of the main trench in a second direction on the upper surface of the drift region is greater than that of the secondary trench in a first direction on the upper surface of the drift region, wherein the first direction and the second direction are different directions, and the second direction is a horizontal direction along the upper surface of the drift region, pointing from the source region to the drain region.

17. A trench-type Double diffusion Metal Oxide Semiconductor (DMOS) device, comprising:

a drift region with a first conduction type and a main trench disposed in the drift region;

a drain region with the first conduction type and a source region with the first conduction type, wherein the drain region and the source region are disposed on an upper surface of the drift region and on different sides of the main trench;

a base region with a second conduction type disposed in the drift region, the base region being in contact with and surrounding the source region; and a trench expansion gate comprising a gate insulation layer covering a bottom wall and side walls of the main trench, an expansion gate layer covering a surface of the gate insulation layer, and an insulating dielectric region covering the expansion gate layer and fully filling the main trench, wherein the expansion gate layer comprises a first expansion gate region with the second conduction type, a second expansion gate region with the first conduction type, and a third expansion gate region with the first conduction type; the second expansion gate region is disposed on a surface of the gate insulation layer on a side wall of the main trench near the source region, the third expansion gate region is disposed on a surface of the gate insulation layer on a side wall of the main trench near the drain region, and the first expansion gate region is disposed on a surface of the gate insulation layer on the bottom wall of the main trench, and extends to be adjacent to the second expansion gate region and the third expansion gate region along the surface of the gate insulation layer; an interface between the first expansion gate region and the second expansion gate region is located on a same horizontal plane as a lower boundary of the base region, or is lower than the lower boundary of the base region;

wherein a length of the second expansion gate region in a third direction ranges from 3000 to 5000 angstroms, and/or a length of the third expansion gate region in the third direction ranges from 2000 to 6000 angstroms, and the third direction is a direction perpendicular to the upper surface of the drift region.

18. The trench-type DMOS device according to claim 17, further comprising:

a drain electrode electrically connected to the drain region and the third expansion gate region;

a source electrode electrically connected to the source region; and a gate electrode electrically connected to the second expansion gate region and the fourth expansion gate region.

19. The trench-type DMOS device according to claim 18, further comprising:

a base region lead-out region with the second conduction type located on an upper surface of the base region with the second conduction type, wherein the base region lead-out region is electrically connected to the source electrode, and the base region lead-out region is connected to the source region in a first direction on the upper surface of the drift region; the first direction and a second direction are different directions, and the second direction is a horizontal direction along the upper surface of the drift region, pointing from the source region to the drain region.

* * * * *